US00RE40575E

(19) United States
(12) Reissued Patent
Schmidt et al.

(10) Patent Number: US RE40,575 E
(45) Date of Reissued Patent: Nov. 18, 2008

(54) CONNECTOR INCLUDING REDUCED CROSSTALK SPRING INSERT

(75) Inventors: John David Schmidt, Shakopee, MN (US); Chansy Phommachanh, Plainfield, IL (US); Roy Henneberger, Apple Valley, MN (US)

(73) Assignee: ADC Telecommunications, Inc., Eden Prairie, MN (US)

(21) Appl. No.: 11/067,617

(22) Filed: Feb. 25, 2005

Related U.S. Patent Documents

Reissue of:
(64) Patent No.: 6,629,862
Issued: Oct. 7, 2003
Appl. No.: 10/023,051
Filed: Dec. 17, 2001

U.S. Applications:
(63) Continuation of application No. 09/231,736, filed on Jan. 15, 1999, now Pat. No. 6,334,792.

(51) Int. Cl.
*H01R 24/00* (2006.01)

(52) U.S. Cl. ..... 439/676; 439/941; 439/557
(58) Field of Classification Search ..... 439/676, 439/941, 557, 76.1, 344, 751, 404, 405, 82, 439/552
See application file for complete search history.

(56) References Cited

U.S. PATENT DOCUMENTS

| | | | |
|---|---|---|---|
| 4,274,691 | A | 6/1981 | Abernethy et al. |
| 4,406,509 | A | 9/1983 | Jagen |
| 4,556,264 | A | 12/1985 | Tanaka |
| 4,648,678 | A | 3/1987 | Archer |
| 4,698,025 | A | 10/1987 | Silbernagel et al. |
| 4,971,571 | A | 11/1990 | Puerner |

(Continued)

FOREIGN PATENT DOCUMENTS

| | | | |
|---|---|---|---|
| EP | 0 777 304 | A2 | 6/1997 |
| EP | 0 692 884 | B1 | 3/2002 |
| GB | 2 314 466 | A | 12/1997 |
| WO | WO 97/44862 | | 11/1997 |
| WO | WO 00/42682 | | 7/2000 |

OTHER PUBLICATIONS

"EX.3: Commscope's Preliminary Responsive Claim Chart to U.S. Pat. No. 6,542,131," *ADC Telecommunications, Inc.*v. *CommScope Solutions Properties, LLC and CommScope Solutions, Inc.*, District of Minnesota, Civil Action No. 05–02584 ADM–JSM, pp. 1–7 (Jul. 18, 2006).
Exhibit A The Siemon Company Catalog pages—front cover page through page 1.39, and back cover page, dated 1999.
Exhibit B Panduit Corp., Tinley Park, Illinois "Panduit® Communication Products", cover page, pp. 40–49, and back page (1996).
Exhibit A: "Complaint," *ADC Telecommunications , Inc.*v. *CommScope Solutions Properties, LLC and CommScope Solutions, Inc.*, District of Minnesota, Civil Action No. 0:05–cv–02584 ADM–JSM, pp. 1–10 (Nov. 7, 2005).

(Continued)

*Primary Examiner*—Javaid Nasri
(74) *Attorney, Agent, or Firm*—Merchant & Gould P.C.

(57) ABSTRACT

A telecommunications electrical connector positions the contacts in a manner to reduce crosstalk problems. An insert assembly positions the spring contacts within a jack for electrical contact with the contacts of a plug. The insert assembly staggers the relative positions of adjacent spring contacts in the y-direction, and staggers the spring contact pivot points in the x-direction, yet maintains a common contact region for all the spring contacts for contacting the contacts of the plug. The distal ends of alternating spring contacts are positioned so as to increase the isolation between adjacent springs. The insert assembly includes selected air passages between spring contacts mounted to the insert assembly to increase isolation and selected dielectric to increase crosstalk cancellation.

28 Claims, 13 Drawing Sheets

U.S. PATENT DOCUMENTS

| | | | |
|---|---|---|---|
| 5,030,123 | A | 7/1991 | Silver |
| 5,041,018 | A | 8/1991 | Arnett |
| 5,044,981 | A | 9/1991 | Suffi et al. |
| 5,071,371 | A | 12/1991 | Harwath et al. |
| 5,156,554 | A | 10/1992 | Rudoy et al. |
| 5,186,647 | A | 2/1993 | Denkmann et al. |
| 5,238,426 | A | 8/1993 | Arnett |
| 5,299,956 | A | 4/1994 | Brownell et al. |
| 5,302,140 | A | 4/1994 | Arnett |
| 5,310,363 | A | 5/1994 | Brownell et al. |
| 5,338,231 | A | 8/1994 | Wilhite |
| 5,362,257 | A | 11/1994 | Neal et al. |
| 5,399,107 | A | 3/1995 | Gentry et al. |
| 5,403,200 | A | 4/1995 | Chen |
| 5,474,474 | A | 12/1995 | Siemon et al. |
| 5,478,261 | A | 12/1995 | Bogese, II |
| 5,503,572 | A | 4/1996 | White et al. |
| 5,580,257 | A | 12/1996 | Harwath |
| 5,624,274 | A | 4/1997 | Lin |
| 5,639,261 | A | 6/1997 | Rutkowski et al. |
| 5,639,266 | A | 6/1997 | Patel |
| 5,647,043 | A | 7/1997 | Anderson et al. |
| 5,659,650 | A | 8/1997 | Arnett |
| 5,674,093 | A | 10/1997 | Vvaden |
| 5,700,167 | A | 12/1997 | Pharney et al. |
| 5,713,764 | A | 2/1998 | Brunker et al. |
| 5,716,237 | A | 2/1998 | Conorich et al. |
| 5,735,714 | A | 4/1998 | Orlando et al. |
| 5,759,070 | A | 6/1998 | Belopolsky |
| 5,779,503 | A | 7/1998 | Tremblay et al. |
| 5,785,546 | A | 7/1998 | Hamai et al. |
| 5,791,935 | A | 8/1998 | Yamanashi |
| 5,791,943 | A | 8/1998 | Lo et al. |
| 5,795,186 | A | 8/1998 | Tulley et al. |
| 5,885,111 | A | 3/1999 | Yu |
| 5,911,602 | A | 6/1999 | Vaden |
| 5,924,896 | A | 7/1999 | Arnett et al. |
| 5,938,479 | A | 8/1999 | Paulson et al. |
| 5,941,734 | A | 8/1999 | Ikeda et al. |
| 5,947,761 | A | 9/1999 | Pepe |
| 5,947,772 | A | 9/1999 | Arnett et al. |
| 5,997,358 | A | 12/1999 | Adriaenssens et al. |
| 6,066,005 | A | 5/2000 | Belopolsky |
| 6,083,052 | A | 7/2000 | Adams et al. |
| 6,086,428 | A | 7/2000 | Pharney et al. |
| 6,089,909 | A | 7/2000 | Tokuwa |
| 6,089,923 | A | 7/2000 | Phommachanh |
| 6,102,722 | A | 8/2000 | Arnett |
| 6,116,964 | A | 9/2000 | Goodrich et al. |
| 6,165,023 | A | 12/2000 | Troutman et al. |
| 6,186,834 | B1 | 2/2001 | Arnett et al. |
| 6,196,880 | B1 | 3/2001 | Goodrich et al. |
| 6,234,836 | B1 | 5/2001 | Schmidt et al. |
| 6,270,358 | B1 | 8/2001 | Nozick |
| 6,283,796 | B1 | 9/2001 | Yeh |
| 6,334,792 | B1 | 1/2002 | Schmidt et al. |
| 6,350,158 | B1 | 2/2002 | Arnett et al. |
| 6,371,793 | B1 | 4/2002 | Doorhy et al. |
| 6,524,131 | B2 | 2/2003 | Schmidt et al. |
| 6,629,862 | B2 | 10/2003 | Schmidt et al. |
| 6,814,624 | B2 | 11/2004 | Clark et al. |

OTHER PUBLICATIONS

Exhibit B: "Answer and Counterclaims," ADC Telecommunications, Inc. v. CommScope Solutions Properties, LLC and CommScope Solutions, Inc., District of Minnesota, Civil Action No. 0:05–cv–02584 ADM–JSM, pp. 1–16 (Dec. 29, 2005).

Exhibit C: "ADC's Reply and Counterclaims to Defendants'Counterclaims," *ADC Telecommunications, Inc.*v. *CommScope Solutions Properties, LLC and CommScope Solutions, Inc.*, District of Minnesota, Civil Action No. 0:05–cv–02584 ADM–JSM, pp. 1–10 (Feb. 17, 2006).

Exhibit D: "First Amended Complaint," *ADC Telecommunications, Inc. and ADC GMBH* v. *CommScope Solutions Properties, LLC and CommScope Solutions, Inc.*, District of Minnesota, Civil Action No. 0:05–cv–02584 ADM–JSM, pp. 1–12 (Apr. 19, 2006).

Exhibit E: "Answer and Counterclaims to First Amended Complaint," ADC Telecommunications, Inc, and ADC GmbH v. CommScope Solutions Inc., District of Minnesota, Civil Action No. 0:05–cv–02584 ADM–JSM, pp. 1–17 (Apr. 28, 2006).

The Siemon Company Catalog pages—front cover page through p. 139, and back cover page, date 1999.

Panduit Corp., Tinley Park, Illinois, "Panduit® Communication Products", cover page, pp. 40–49, back page (1996).

CONNECTOR INCLUDING REDUCED CROSSTALK SPRING INSERT

Matter enclosed in heavy brackets [ ] appears in the original patent but forms no part of this reissue specification; matter printed in italics indicates the additions made by reissue.

This is a continuation of application Ser. No. 09/231,736, file Jun. 15, 1999, now U.S. Pat. No. 6,334,792.

*Notice: More than one reissue application has been filed for the reissue of U.S. Pat. No. 6,629,862. The reissue patent applications include the present reissue application, and a divisional reissue application, Ser. No. 11/784,781, now abandoned.*

FIELD OF THE INVENTION

The present invention relates to electrical connectors, and specifically to electrical connectors having closely spaced contacts where interference from crosstalk in the connector is a concern.

BACKGROUND OF THE INVENTION

Various electrical connectors are known for use in the telecommunications industry to transmit voice, data, and video signals. It is common for some electrical connectors to be configured to include a plug which is connectable to a jack mounted in the wall, or as part of a panel or other telecommunications equipment mounted to a rack or cabinet. The jack includes a housing which holds a plurality of closely spaced spring contacts in the appropriate position for contacting the contacts of a plug inserted into the jack. The spring contacts of the jack are often mounted to a printed circuit board, either vertically or horizontally. An RJ45 plug and jack connector system is one well known standard including closely spaced contacts.

Crosstalk between the contacts in telecommunications connectors is a concern due to the close spacing of the contacts. U.S. Pat. Nos. 5,399,107; 5,674,093; and 5,779,503 are examples of various connectors including jacks and plugs which attempt to address the problem of crosstalk. It is desired to improve performance of the electrical connectors, such as an RJ45 connector, where crosstalk problems increase as higher frequencies are transmitted through the connector.

SUMMARY OF THE INVENTION

One aspect of the present invention relates to an electrical connector for connecting to a plug having a plurality of electrical contacts, the connector including a plurality of first and second metallic spring contacts. Each of the first and second spring contacts includes: 1) a circuit board connection and for connecting to a circuit board; 2) a first longitudinally extending section; 3) a main bend section; and 4) a second longitudinally extending section engageable with a contact of the plug. The first longitudinally extending section, the main bend section, and the second longitudinally extending section define a general V-shape. The second longitudinally extending section of the first spring contacts have two linear portions joined at a bend portion. The second longitudinally extending section of the second spring contacts extends linearly. A dielectric contact housing holds the spring contacts, wherein the contact housing defines an x-axis, a y-axis and a z-axis. The contact housing is configured for receipt of the plug in a direction of the x-axis, wherein the first and second spring contacts are arranged such that: 1) the first and second spring contacts alternate along the z-axis; 2) the first longitudinally extending sections of the first spring contacts are in a plane displaced along the y-axis from a plane defined by the first longitudinally extending sections of the second spring contacts; and 3) the main bends of the first spring contacts are displaced along the x-axis from the main bends of the second spring contacts.

A printed circuit board is mounted to the first and second spring contacts at the circuit board connection ends. The printed circuit board may define either a plane parallel to the x and z-axes, or a plane parallel to the y and z axes.

In the case of a one preferred embodiment, the contact housing includes a base for receiving each of the first longitudinally extending sections of the first and second spring contacts, wherein the base defines at least one channel extending in the direction of the x-axis between the first longitudinally extending sections of the first spring contacts and the first longitudinally extending sections of the second spring contacts. In the case of another preferred embodiment, the contact housing includes a base having a divider extending from a top surface, with the divider defining a plurality of alternating first and second channels. Each of the first and second channels receives one of the first and second spring contacts. The first channels extend at an angle to the x and y-axes, and the second channels extend parallel to the x-axis.

Another aspect of the present invention relates to an electrical connector for connecting to a plug having a plurality of electrical contacts where the connector includes a plurality of first and second metallic spring contacts. Each of the first and second spring contacts includes: 1) a circuit board connection end for connecting to a circuit board; 2) a first longitudinally extending section; 3) a main bend section; and 4) a second longitudinally extending section. The first longitudinally extending section, the main bend section, and the second longitudinally extending section define a general V-shape. A dielectric contact housing holds the spring contacts, wherein the contact housing defines an x-axis, a y-axis and a z-axis. The contact housing is configured for receipt of the plug in a direction of the x-axis, wherein the first and second spring contacts are arranged such that: 1) the first and second spring contacts alternate along the z-axis; 2) the first longitudinally extending sections of the first spring contacts are in a plane displaced along the y-axis from a plane defined by the first longitudinally extending sections of the second spring contacts; and 3) the contact housing including a base for receiving each of the first longitudinally extending sections of the first and second spring contacts, wherein the base defines at least one channel extending in the direction of the x-axis between the first longitudinally extending sections of the first spring contacts and the first longitudinally extending sections of the second spring contacts.

DETAILED DESCRIPTION OF THE PREFERRED EMBODIMENTS

The present invention is concerned with improving performance of electrical connectors including closely spaced electrical contacts where crosstalk may be a problem, especially as increasingly higher frequency signals are desired for use with the electrical connectors.

Figure 1:
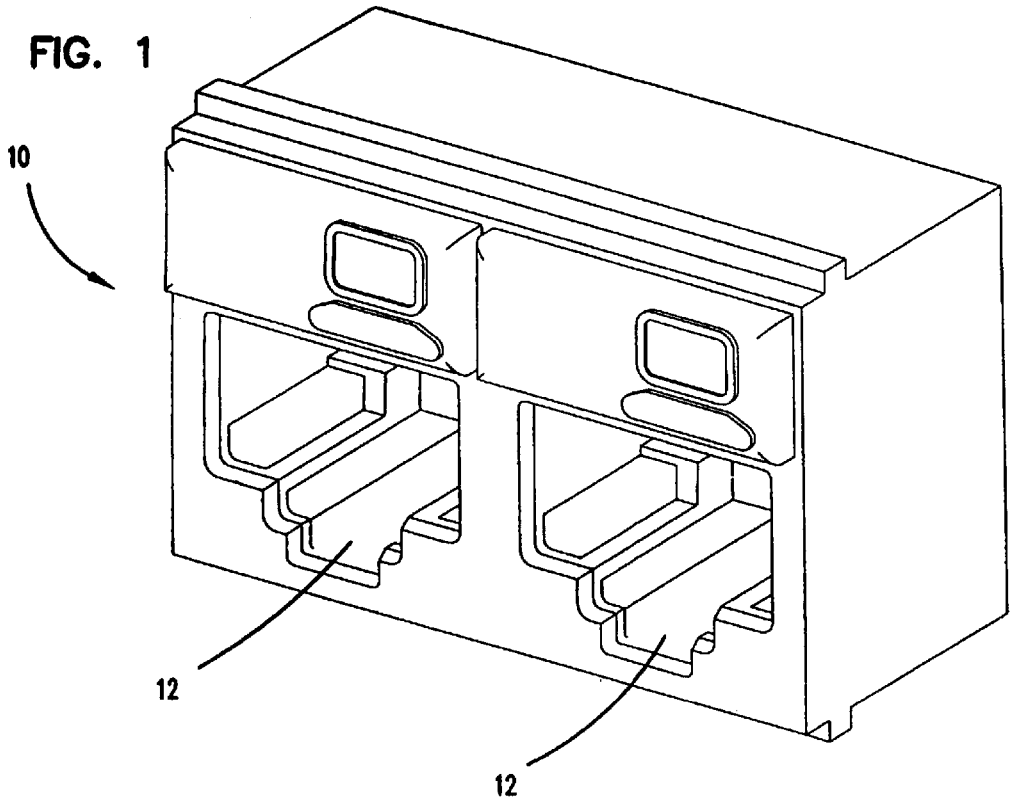
FIG. 1 is a perspective view of a jack assembly in accordance with the present invention including two jacks, each for receiving a plug.
Figure 2:
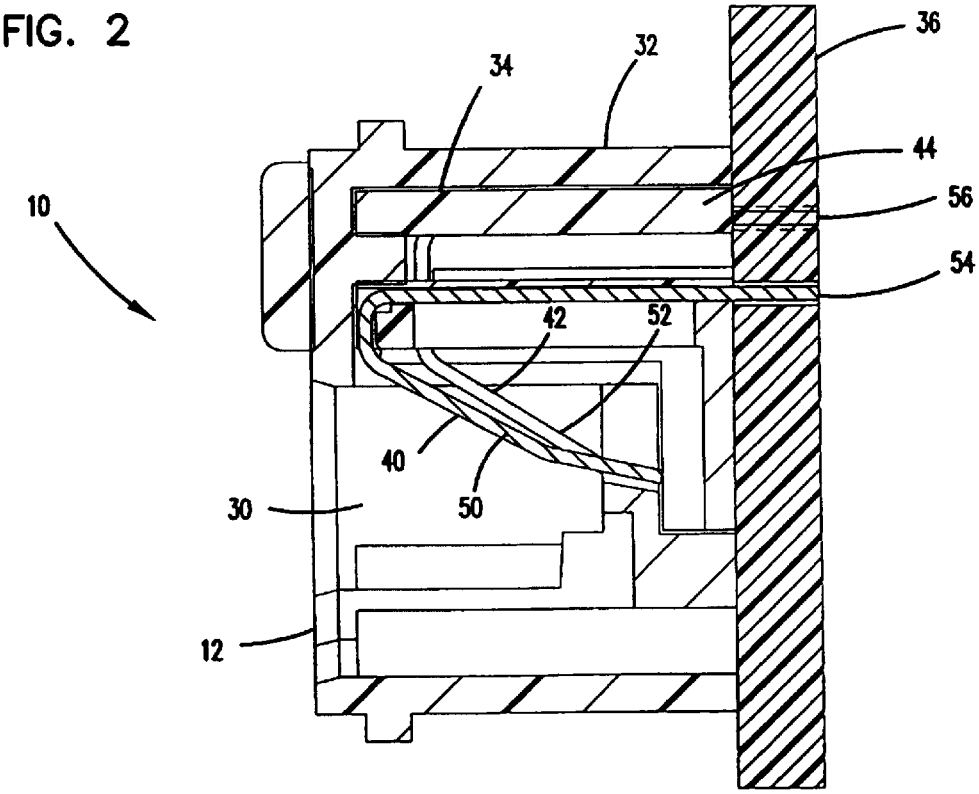
FIG. 2 is a cross-sectional side view of the jack assembly of FIG. 1 through one of the jacks and showing a vertically mounted printed circuit board.

FIGS. 1 and 2 show an example of one jack assembly 10 including two jacks 12 each sized for receipt of a plug 14 (See FIGS. 11, 12, 22 and 23). Plug 14 typically includes a plurality of metallic contacts 16, 18 for making contact with electrical spring contacts 40, 42 within each jack 12. Contacts 16, 18 are housed in a housing 20 of plug 14. Plug 14 also includes a latching tab 22 for mounting plug 14 to jack 12. As shown in the illustrated preferred embodiments, jack 12 and plug 14 are 8 contact type (4 twisted pair) connectors as in an RJ45 connector.

As shown in FIG. 2, each jack 12 includes a cavity 30 for receipt of plug 14. An outer housing 32 encloses an insert assembly 34. In the example of FIG. 2, insert assembly 34 is a vertical insert assembly including a vertically mounted printed circuit board 36. Insert assembly 34 further includes a plurality of metallic spring contacts 40, 42 mounted to a contact housing 44. Spring contacts 40, 42 have first ends 50, 52 disposed within cavity 30 for contacting contacts 18, 20 of plug 14. Spring contacts 40, 42 define a general V-shape. First ends 50, 52 flex inwardly as the plug 14 is inserted into cavity 30. Opposite ends 54, 56 of spring contacts 40, 42 extend from contact housing 44 to mount to printed circuit board 36, such as by soldering.

While the present invention is particularly useful in an RJ45 connector, other connectors including jack and plug arrangements where the electrical contacts are held in close proximity may also benefit by including one or more of the features disclosed herein for reducing crosstalk.

Figure 6:
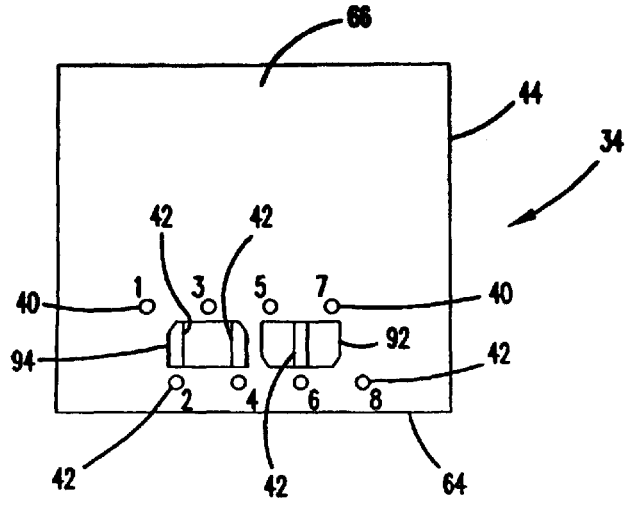
FIG. 6 is an opposite end view of the vertical insert assembly of FIG. 3 to the view of FIG. 3.
Figure 7:
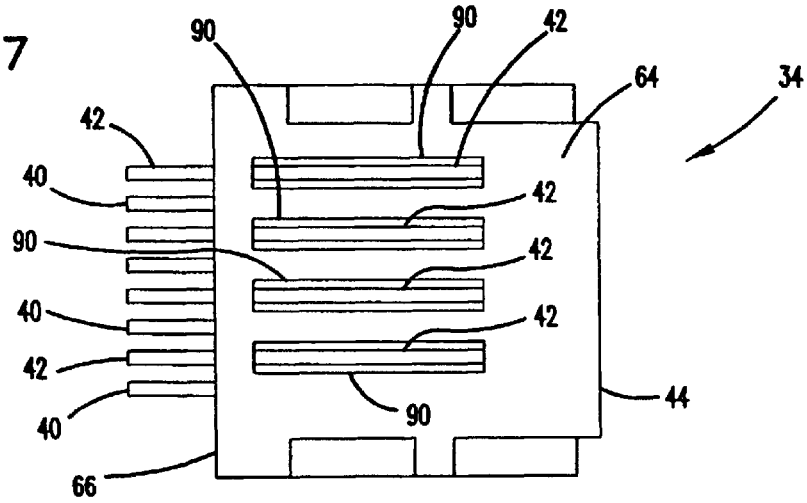
FIG. 7 is a bottom view of the vertical insert assembly of FIG. 3.
Figure 8:
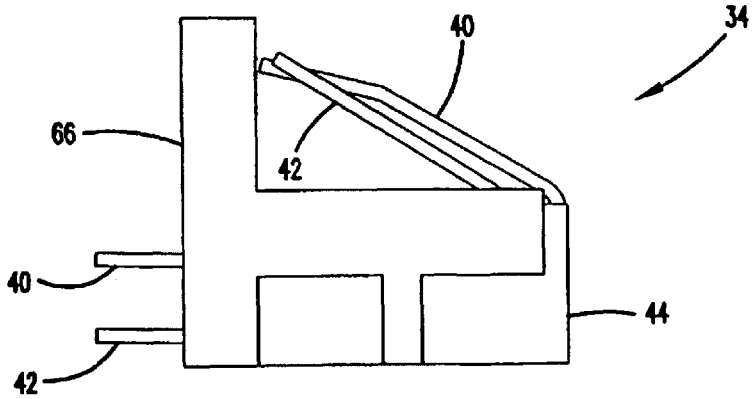
FIG. 8 is a side view of the vertical insert assembly of FIG. 3.

With respect to an RJ45 connector, there are eight contacts. The plugs and jacks have eight aligned contacts 1-2-3-4-5-6-7-8 (4 each of contacts 16, 18, and spring contacts 40, 42, respectively, each arranged in an alternating manner). See the example embodiments of FIGS. 6 and 19 for the contact numbering. The plug contacts have four pairs of twisted pair cable terminated to them. These pairs are typically paired as follows: 4-5, 3-6, 1-2 and 7-8. Because of the pair arrangement, there is unbalanced capacitance and inductance which creates the crosstalk between pairs 2-3, 3-4, 5-6 and 6-7. Therefore, it is desirable that these contacts be isolated as much as possible from each other within the jack. Furthermore, the pairs in the jack can be balanced by positioning certain contact combinations together to cancel crosstalk. These pair combinations are 1-3, 2-4, 3-5, 4-6, 5-7 and 6-8. Therefore, it is desirable for the jack to have a lower amount of coupling between contacts 2-3, 3-4, 5-6 and 67, and to have a higher amount of coupling between contacts 1-3, 2-4, 3-5, 4-6, 5-7 and 6-8.

Figure 9:
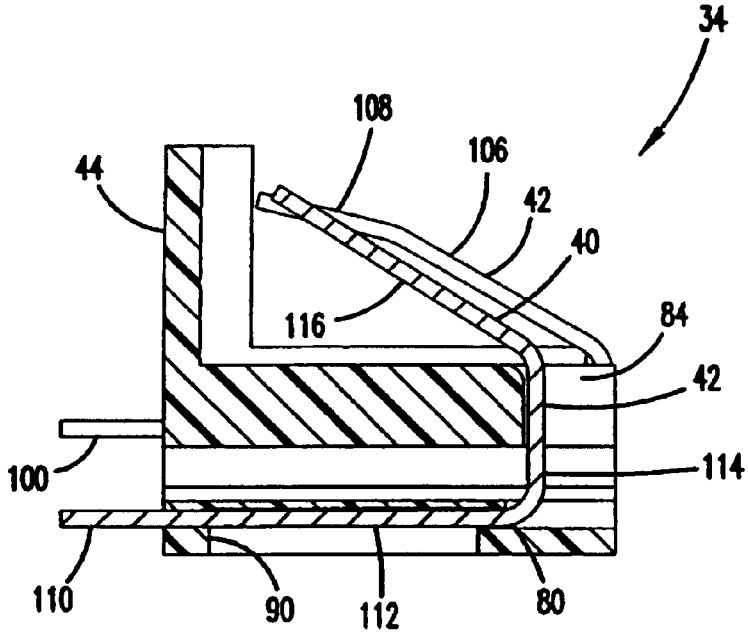
FIG. 9 is a cross-sectional side view of the vertical insert assembly of FIG. 3, taken along lines 9—9 of FIG. 5.
Figure 10:
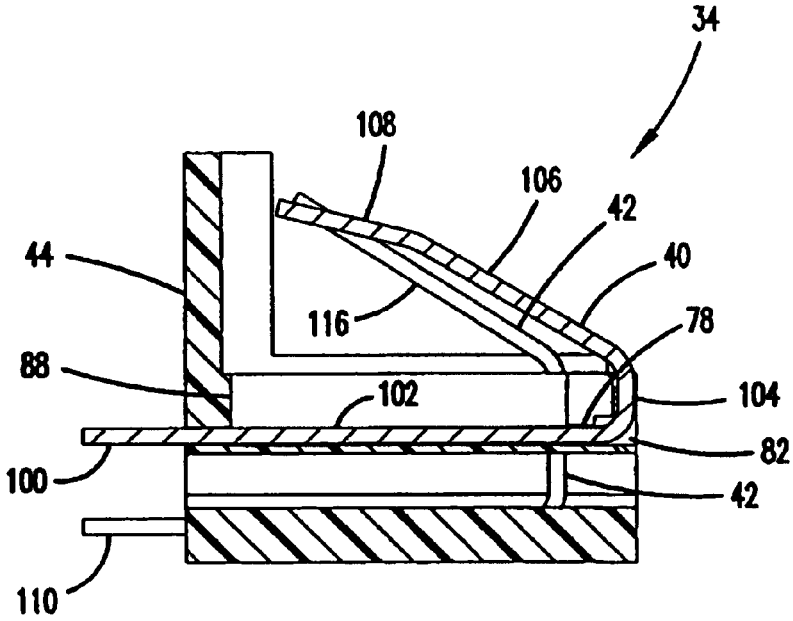
FIG. 10 is a further cross-sectional side view of the vertical insert assembly of FIG. 3, taken along lines 10—10 of FIG. 5.
Figure 11:
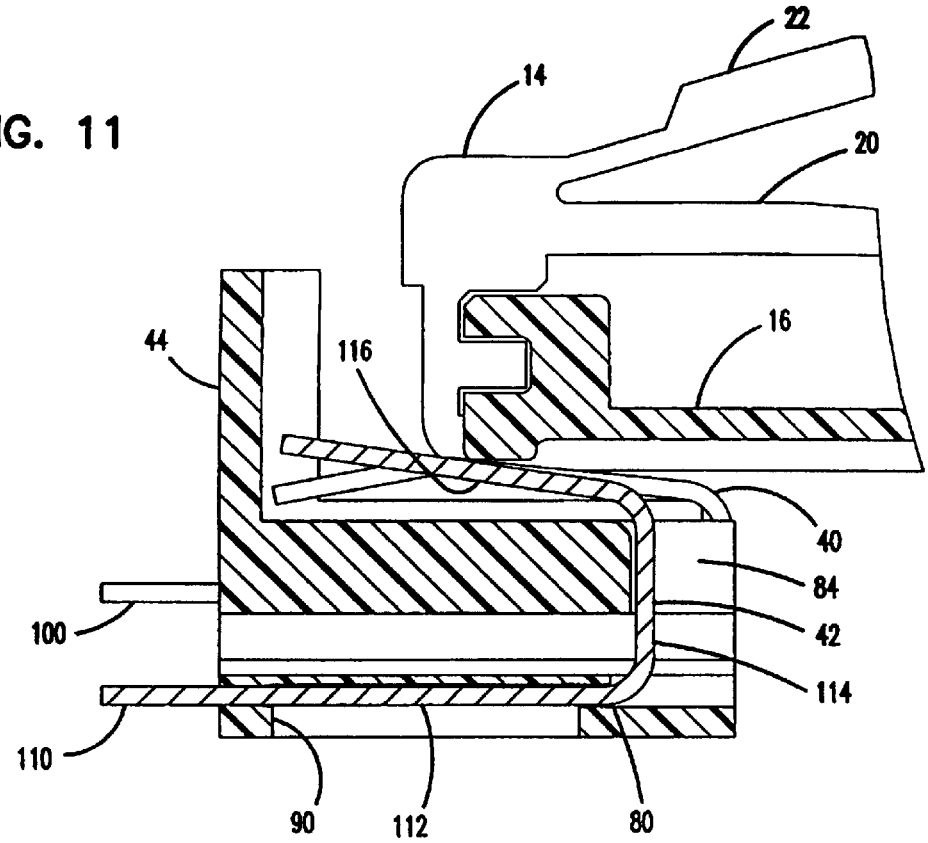
FIG. 11 is a cross-sectional side view like the view of FIG. 9, showing a plug with its contacts in electrical contact with the spring contacts of the vertical insert assembly.
Figure 12:
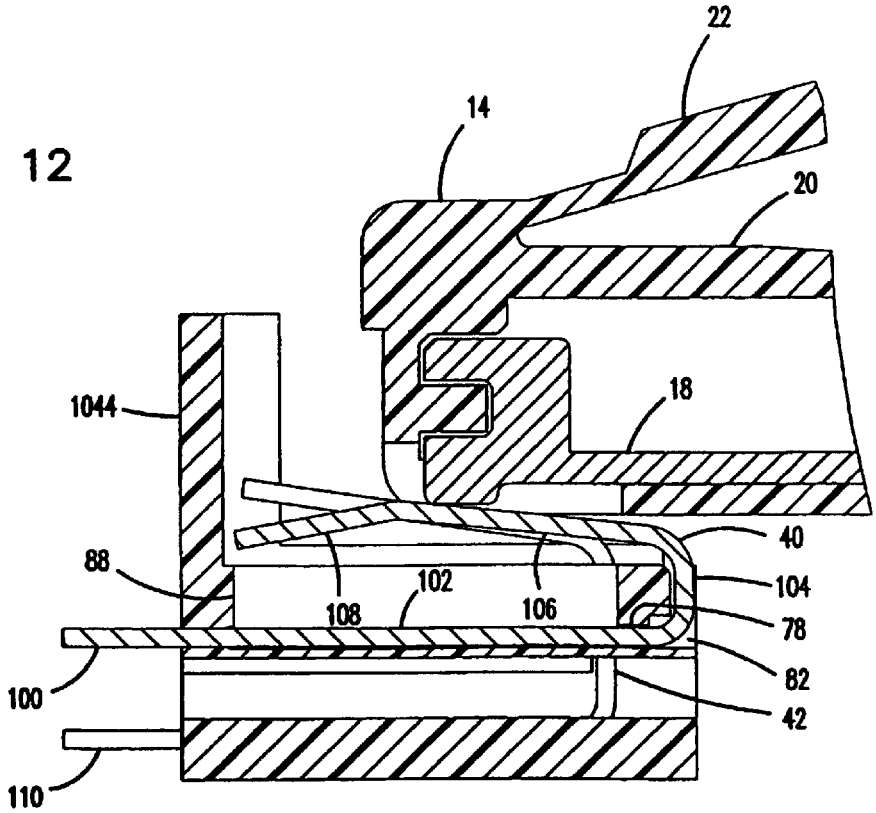
FIG. 12 is a further cross-sectional side view like the view of FIG. 10, showing the plug in electrical contact with the spring contacts of the vertical insert assembly.
Figure 13:
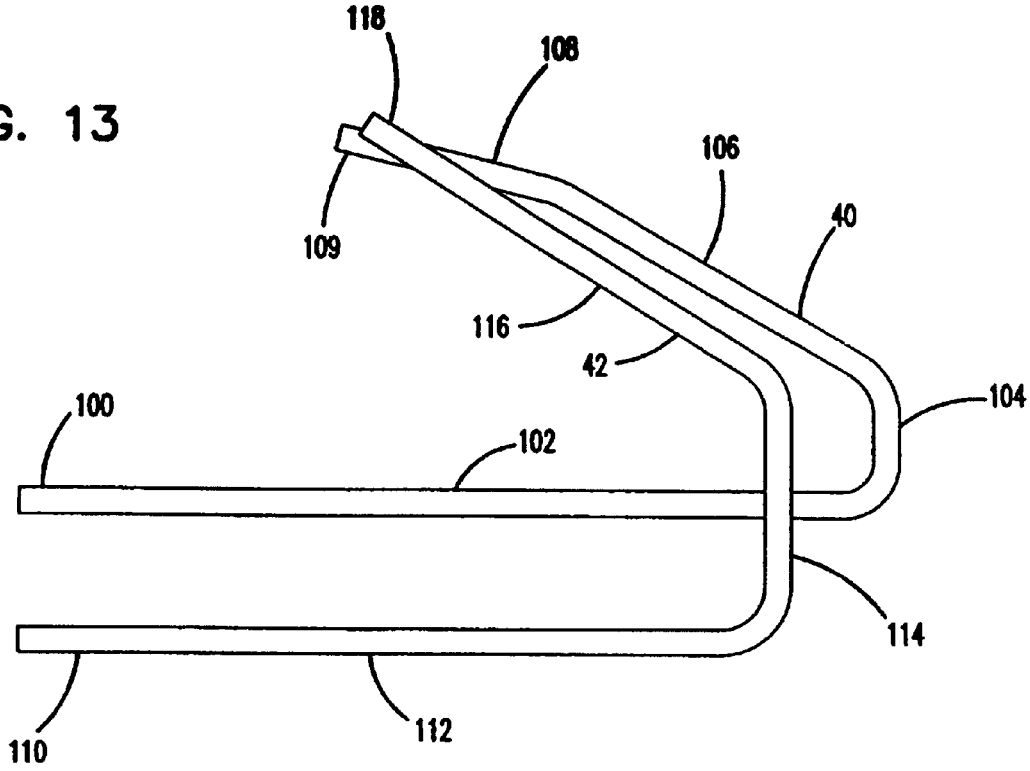
FIG. 13 is a side view of the two configurations of the spring contacts of the vertical insert assembly of FIG. 3, shown in their relative positions.
Figure 24:
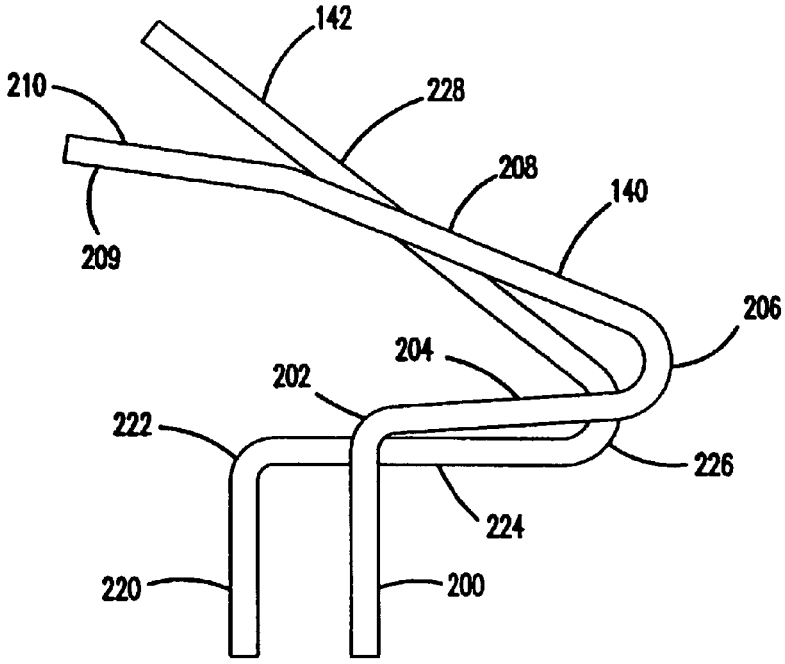
FIG. 24 is a side view of the two configurations of the spring contacts of the horizontal insert assembly of FIG. 16, shown in their relative positions.
Figure 14:
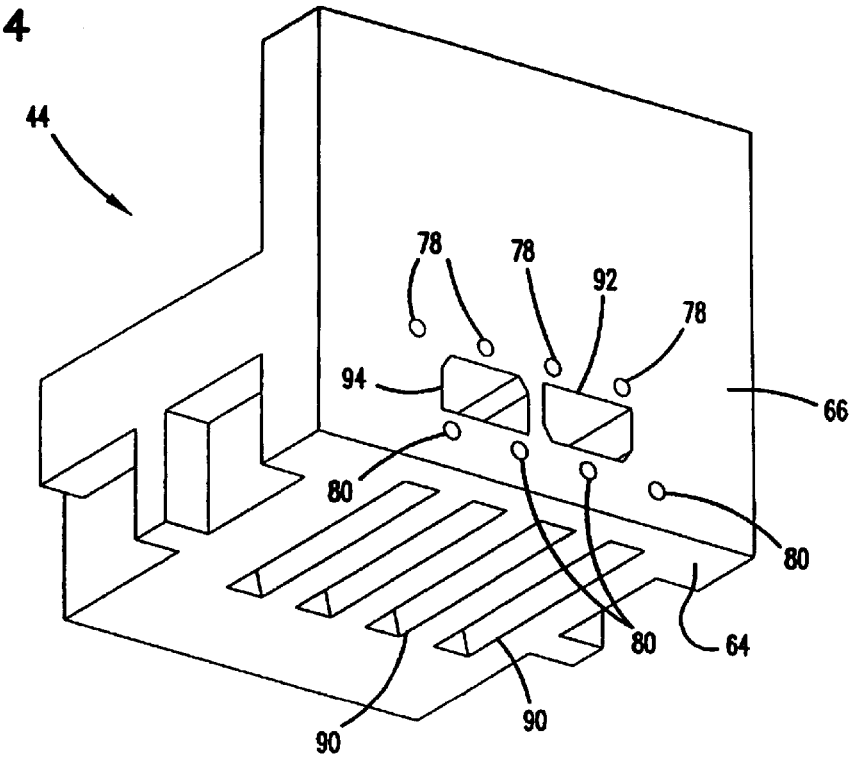
FIG. 14 is a perspective view of the contact housing of the vertical insert assembly of FIG. 3.
Figure 15:
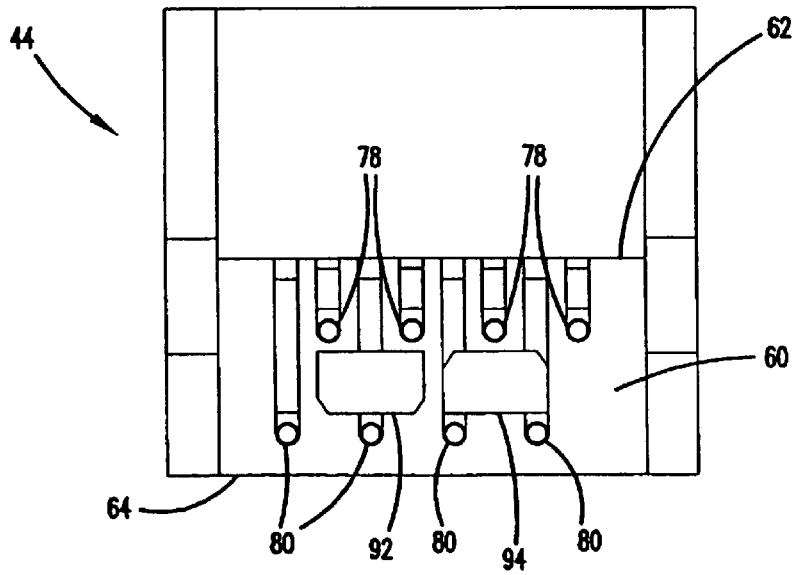
FIG. 15 is an end view of the contact housing of FIG. 14.
Figure 16:
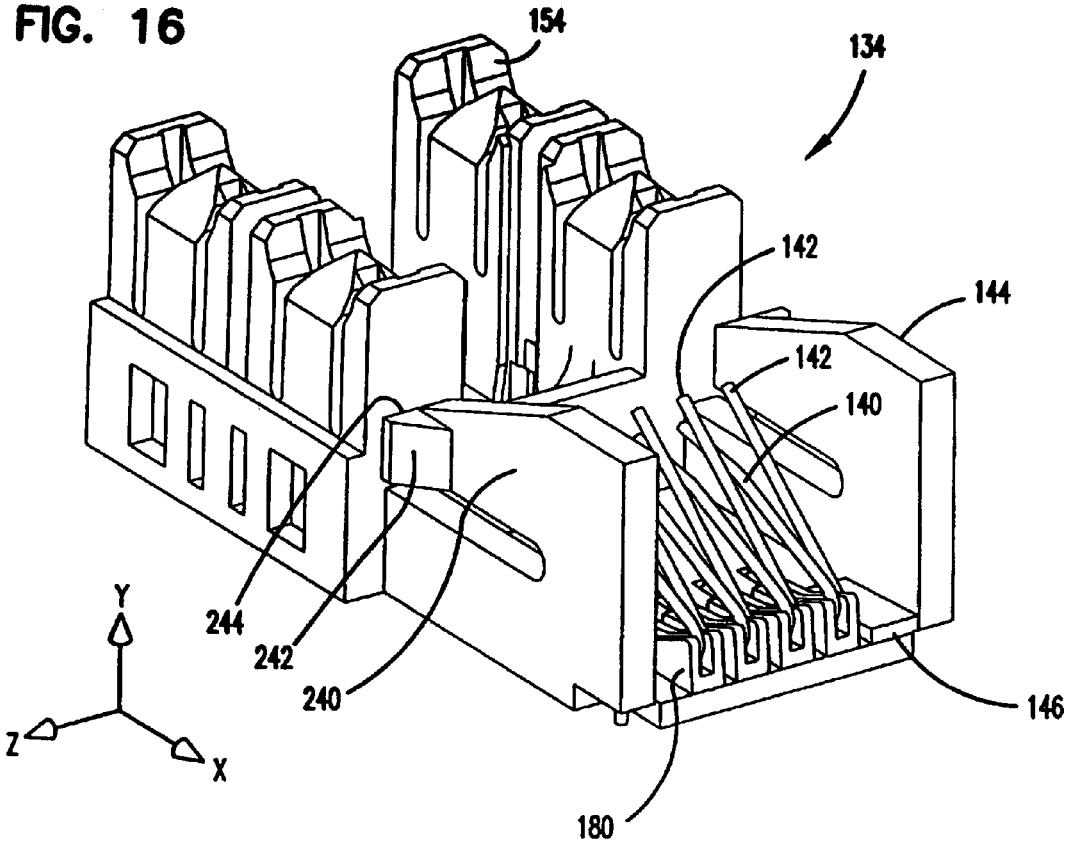
FIG. 16 is a perspective view of a horizontal insert assembly for use with a horizontally mounted printed circuit board, for an alternative jack assembly.
Figure 17:
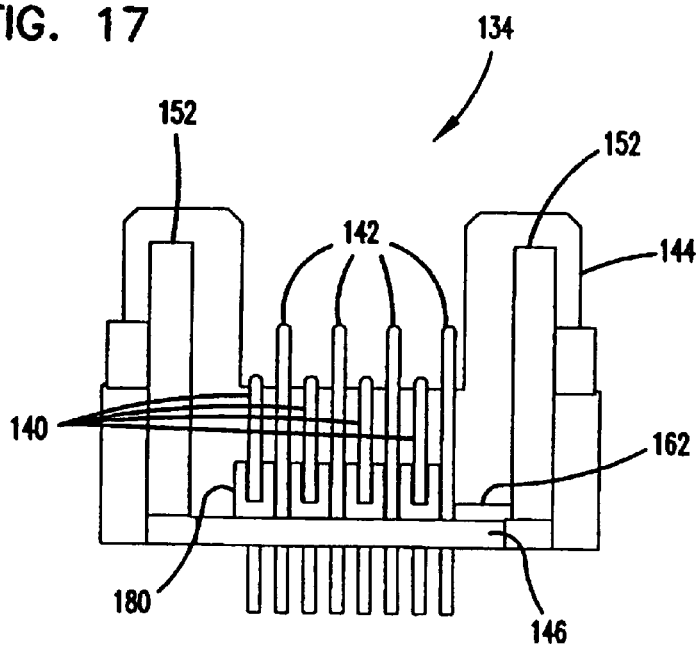
FIG. 17 is an end front view of the horizontal insert assembly of FIG. 16.
Figure 18:
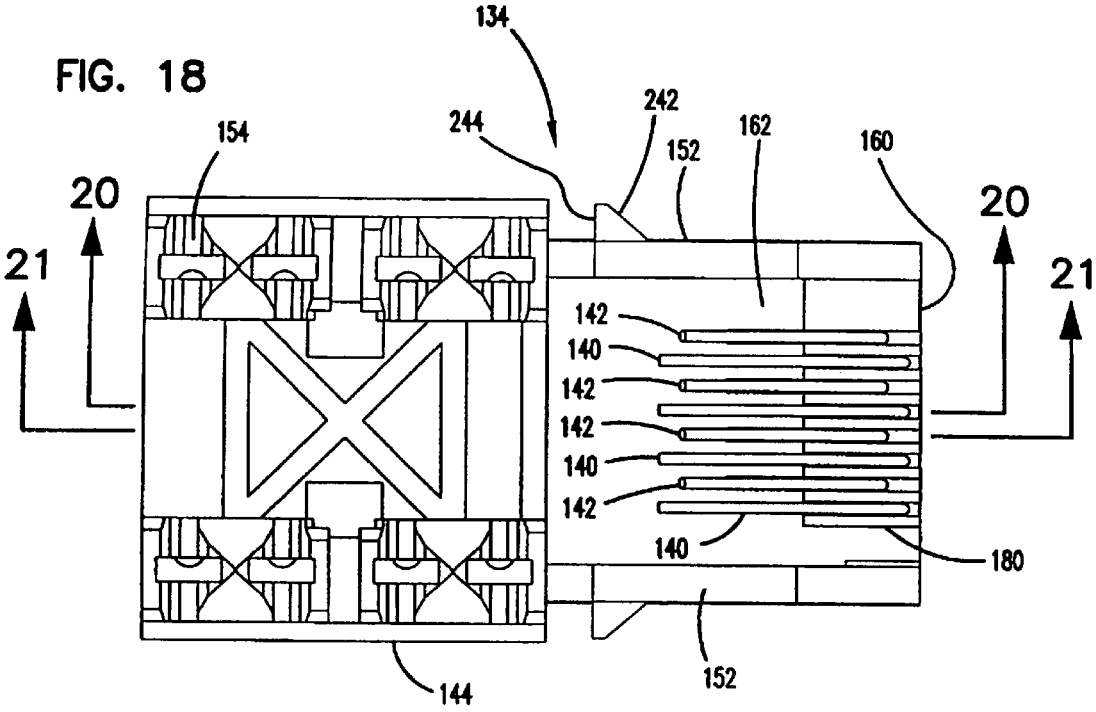
FIG. 18 is a top view of the horizontal insert assembly of FIG. 16.

The present invention utilizes various features in the jack in the preferred embodiments to address crosstalk concerns. Staggering every other spring contact (1, 3, 5 and 7 in one row, and 2, 4, 6 and 8 in the other row, see FIG. 6) allows for the spring contacts to be moved further apart where isolation is desired, and the spring contacts where coupling is desired to be increased, are positioned closer to each other. The spring contacts are also positioned so that they are not in the same contact plane for a significant portion. The free ends of the spring contacts are in the same plane at the contact area with the plug, but before and after they are not in the same plane. (See FIGS. 11 and 12). Each set of four spring contacts pivots at a location that is not in line with the other set of four spring contacts. (See FIGS. 9, 10 and 13). Additionally, the set of four spring contacts which has a smaller angle relative to the other set has a further bend after its contact point with the plug to further increase the isolation between the spring contacts. Further, the contact housing utilizes air spaces in selected locations to further isolate certain spring contacts, and solid material in other selected locations to increase coupling. Positioning material with a higher dielectric constant will increase the coupling and, therefore, crosstalk between two conductors, and air, which has a lower dielectric constant than the housing material, will have less coupling between the two spring contacts. While all of the above noted features are preferred, variations are possible which utilize one or more selected features to improve performance by reducing crosstalk.

Figure 3:
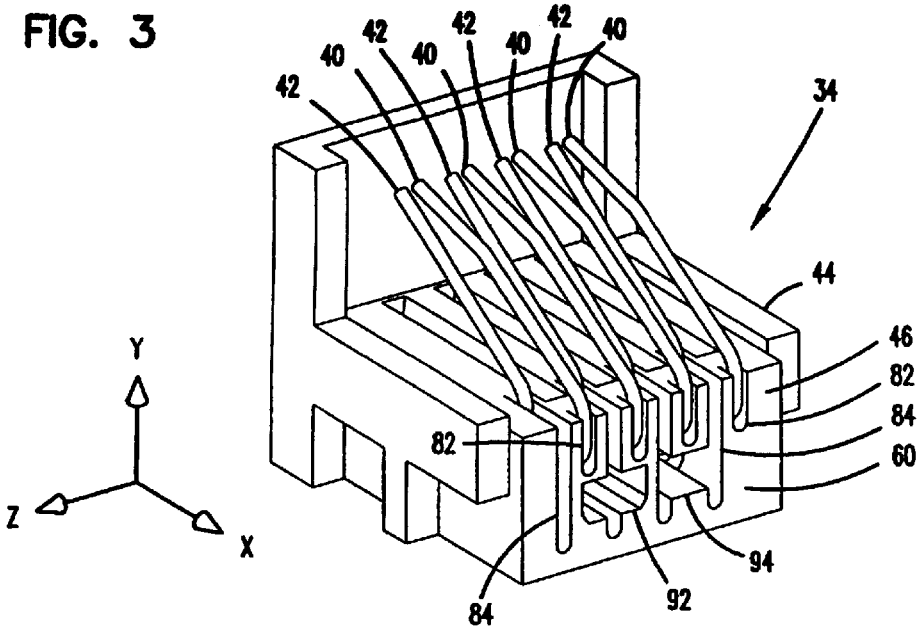
FIG. 3 is a perspective view of the vertical insert assembly used in the jack assembly of FIG. 1.
Figure 4:
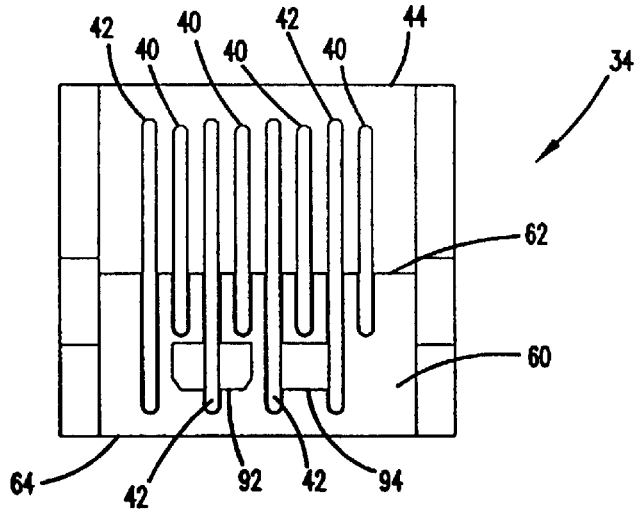
FIG. 4 is an end view of the vertical insert assembly of FIG. 3.
Figure 5:
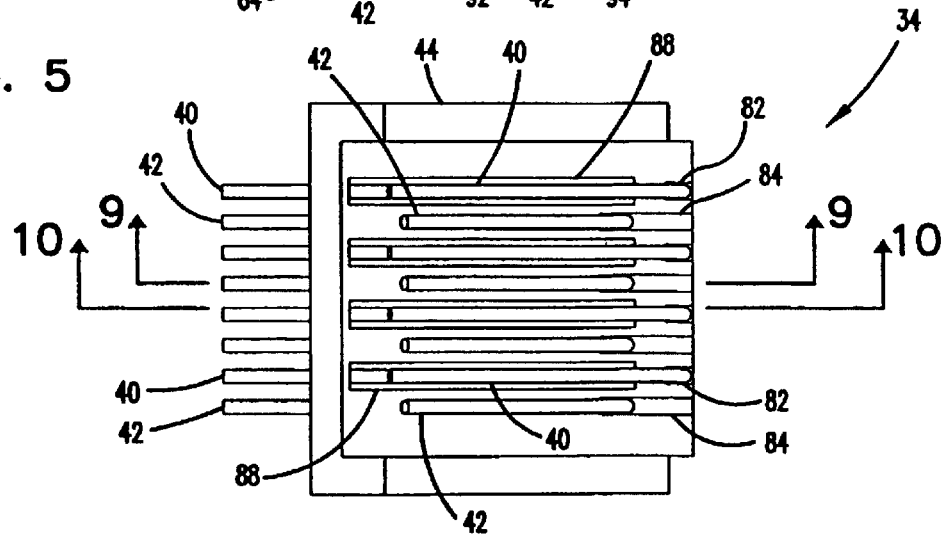
FIG. 5 is a top view of the vertical insert assembly of FIG. 3.

Referring now to FIGS. 3–15, vertical insert assembly 34 is shown in greater detail. Contact housing 44 includes a base 46 having a front 60, a top 62, a bottom 64, and a rear 66. It is to be appreciated that contact housing 44 can be positioned in any orientation as desired in jack assembly 10 or other mounting arrangement. Vertical insert assembly 34 in FIGS. 3–15 defines an x-axis, a y-axis and a z-axis (See FIG. 3) for purposes of this description.

Base 46 includes two sets of longitudinal openings 78 and 80 arranged in a row, each for receipt of a spring contact 40, 42. Longitudinal openings 78, 80 extend in the direction of the x-axis. Each set is staggered in the y-axis direction to facilitate spacing of selected spring contacts to isolate some and couple others. Front channels 82, 84 communicate with longitudinal openings 78, 80, and also receive spring contacts 40, 42. Each first front channel 82 communicates with one of first longitudinal openings 78 to receive one first spring contact 40. Each second front channel 84 communicates with one of second longitudinal openings 80 to receive one second spring contact. Second front channels 84 are deeper than first front channels 82 in the x-axis direction. This results in spacing of the spring contacts 40, 42 in the x-axis direction at the apex region of each spring contact, and along the free ends except for the contact areas. Base 46 further includes top and bottom openings or channels 88, 90 to facilitate manufacture of contact housing 44 from molded materials, such as plastic, for example polyetherimide.

Base 46 further includes longitudinal channels or passageways 92, 94 positioned between the sets of longitudinal openings 78, 80. This results in better decoupling of selected spring contacts, as noted above.

First spring contact 40 includes a board contact end section 100, and a coaxial and longitudinally extending main section 102 positioned in longitudinal opening 78 in base 46. A front bend 104 is positioned in front channel 82 of base 46. Longitudinal contact section 106 extends upwardly at an angle from base 46 in the FIGS. so as to be positioned in the cavity 30 of the jack 12 for electrical contact with the plug 14. Contact section 106 further includes a bend region 108 which positions bend region 108 at an angle relative to a remainder of contact section 106. Contact section 106 of spring contact 40 is comprised of two linear segments in the illustrated embodiment.

Second spring contact 42 includes a board contact end section 110, and a longitudinally extending main section 112, both of which extend parallel to board contact section 100 and longitudinally extending main section 102 of first spring contact 40. A front bend 114 is positioned in front channel 84 of base 46. Front bend 114 is larger in height than front bend 104 of first spring contact 40. Second spring contact 42 includes a longitudinal contact section 116 extending upwardly at an angle from base 46 so as to be positioned in the cavity 30 of the jack 12 for electrical contact with the plug 14. Contact section 1 16 of spring contact 42 is comprised of a linear segment in the illustrated embodiment Both of spring contacts 40, 42 are convenient shapes to manufacture and maintain with a sufficient amount of flexibility to achieve proper contact with the contacts of plug 14.

As shown by referencing FIGS. 3–15, longitudinally extending sections 102, 112 are staggered in the y-axis direction in base 46. Front bends 104, 114 are staggered in the x-axis direction, and bend 108 positions the distal end 109 of spring contact 40 at an angle relative to distal end 118 of contact section 116 of second spring contact 42. Further, base 46 advantageously positions base material between spring contacts 40, 42 where more coupling is desired, and air is advantageously positioned in other selected areas between longitudinal passageways 92, 94 between spring contacts where less coupling between contacts is desired. In this manner, jacks 12 can be provided which address crosstalk concerns such as in category 6 systems, with bandwidths of 250 Megahertz.

Referring now to FIGS. 16–27, a horizontal insert assembly 134 is shown including a contact housing 144 and two sets of spring contacts 140, 142. Contact housing 144 includes a base 146 defining a front 160, a top 162, a bottom 164 and a rear 166. Horizontal insert assembly 134 defines an x-axis, a y-axis, and a z-axis (See FIG. 16) for the purpose of this description. It is to be appreciated that horizontal insert assembly 134 can be mounted in any orientation as desired in a jack assembly. Horizontal insert assembly 134 includes a horizontally positioned printed circuit board 150 (See FIGS. 20 and 21), instead of a vertical mount as in vertical insert assembly 34.

Base 146 includes to opposed sidewalls 152, and a rear connector assembly 154 for terminating wires to horizontal insert assembly 134. Base 146 includes a divider 180 for positioning individual first and second spring contacts 140, 142. Divider 180 has side walls which define first and second channels 182, 184. Each of first channels 182 includes a slight angled surface 186, angled relative to the x and y-axes. Second channels 184 each include a longitudinal surface 188 extending generally parallel to the x-axis, and at a lower elevation from surface 186 along the y-axis. Base 146 further includes openings 190, 192 for allowing spring contacts 140, 142 to pass through base 146 in the direction of the y-axis. Both first and second spring contacts 140, 142 define a general V-shape.

First spring contact 140 includes a board contact end section 200, a first bend 202, followed by a main longitudinal section 204 for receipt in angled surface 186. A second bend 206 is followed by a longitudinal contact section 208. A further bend 210 positions distal end 209 of contact section 208 at an angle relative to a remainder of contact section 208. Second spring contact 142 includes a board contact end section 220, a first bend 222, followed by a longitudinal main section 224 which resides in second channel 184. Second spring contact 142 further includes a second bend 226 followed by a longitudinal contact section 228.

Figure 19:
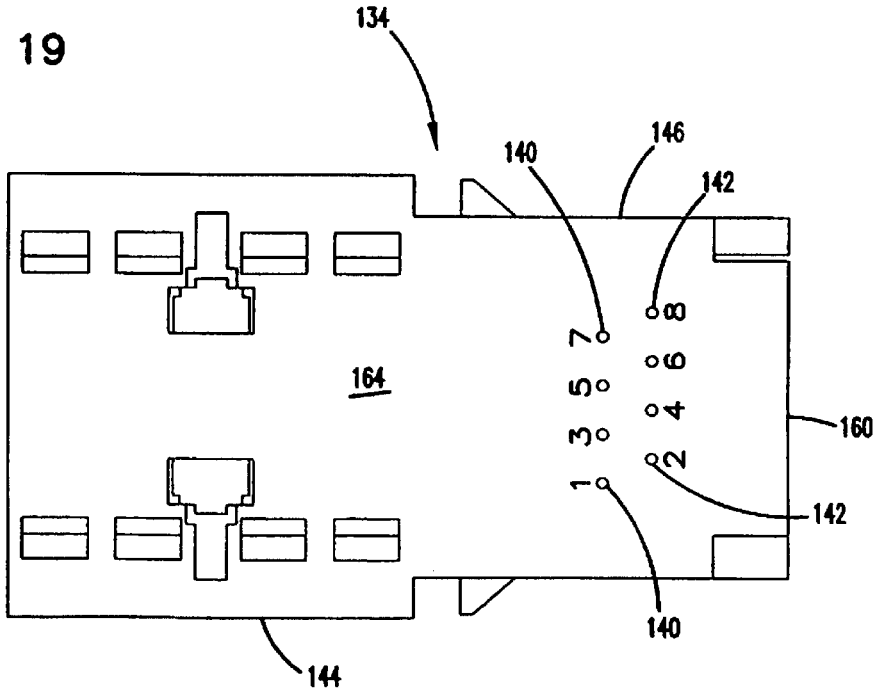
FIG. 19 is a bottom view of the horizontal insert assembly of FIG. 16.
Figure 20:
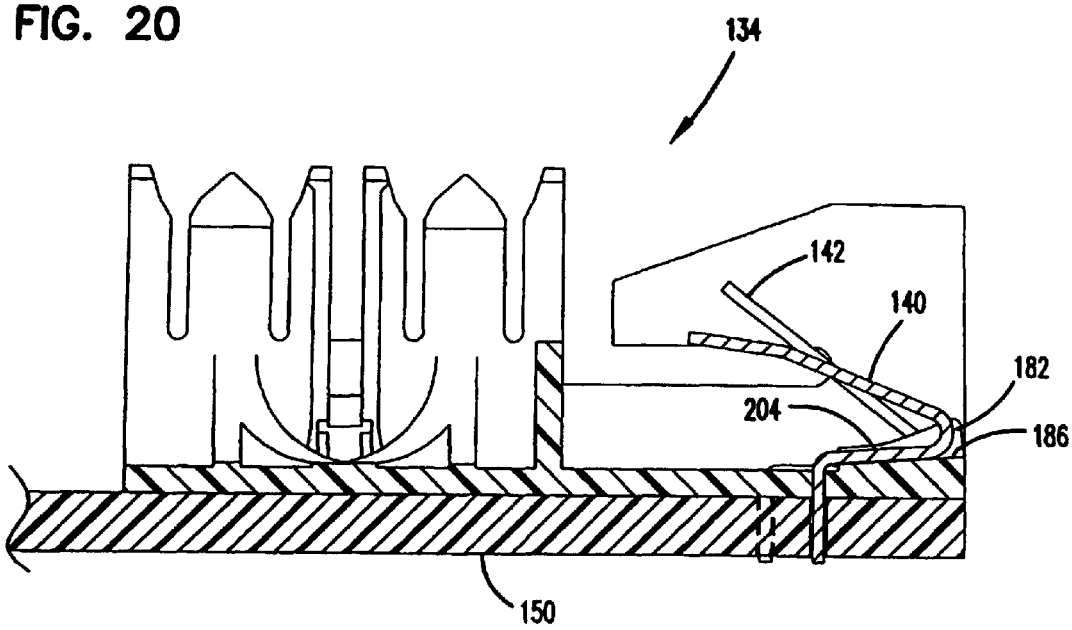
FIG. 20 is a cross-sectional side view of the horizontal insert assembly of FIG. 16, taken along lines 20—20 of FIG. 18.
Figure 21:
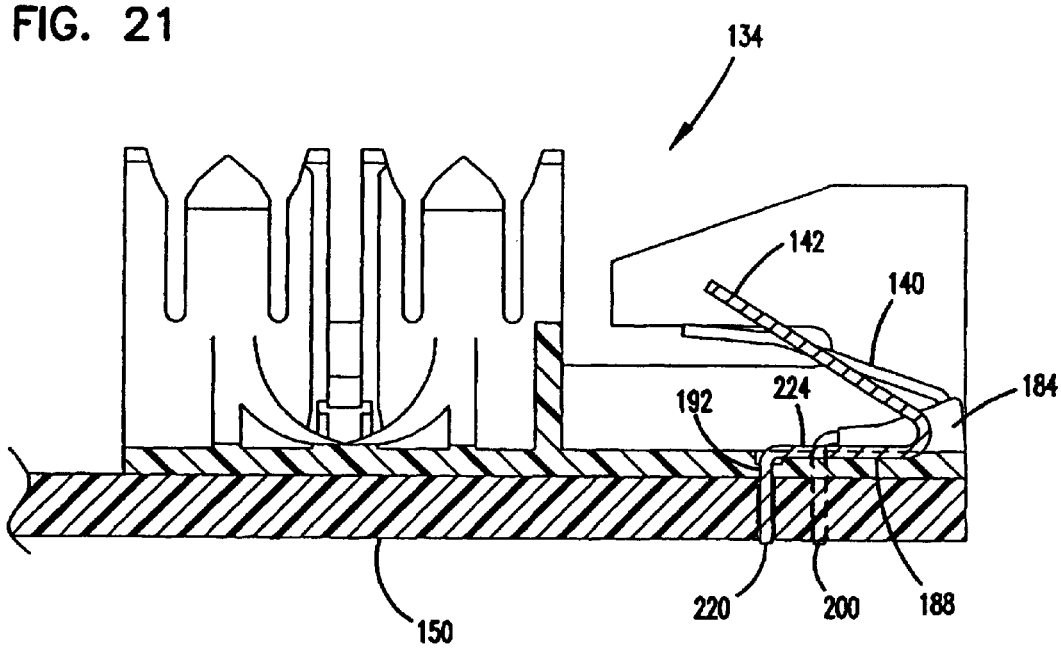
FIG. 21 is a further cross-sectional side view of the horizontal insert assembly of FIG. 16, taken along lines 21—21 of FIG. 18.
Figure 22:
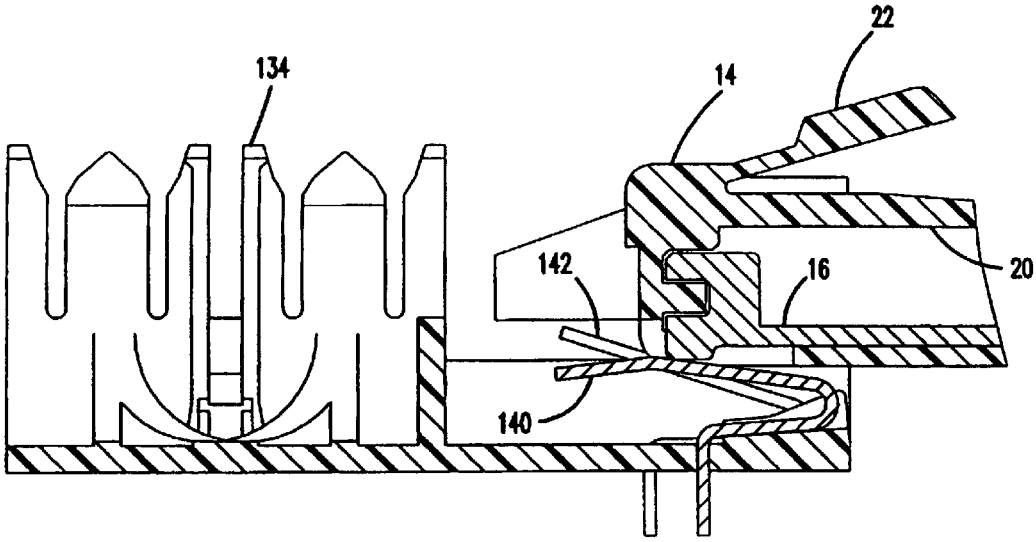
FIG. 22 is a cross-sectional side view of the horizontal insert assembly like the view of FIG. 20, showing a plug in electrical contact with the spring contacts of the horizontal insert assembly.
Figure 23:
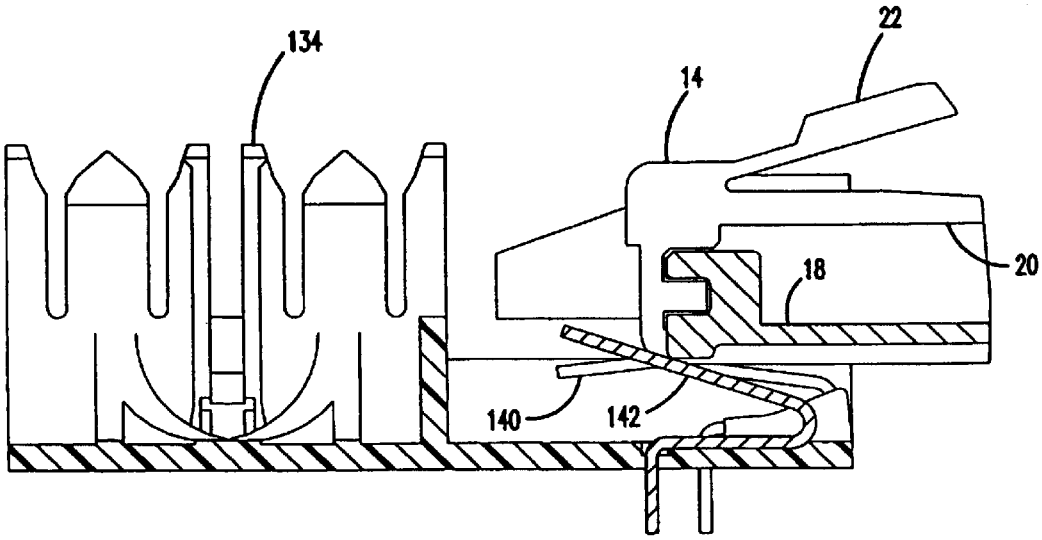
FIG. 23 is a further cross-sectional side view of the horizontal insert assembly like the view of FIG. 21, showing the plug in electrical contact with the spring contacts of the horizontal insert assembly.
Figure 25:
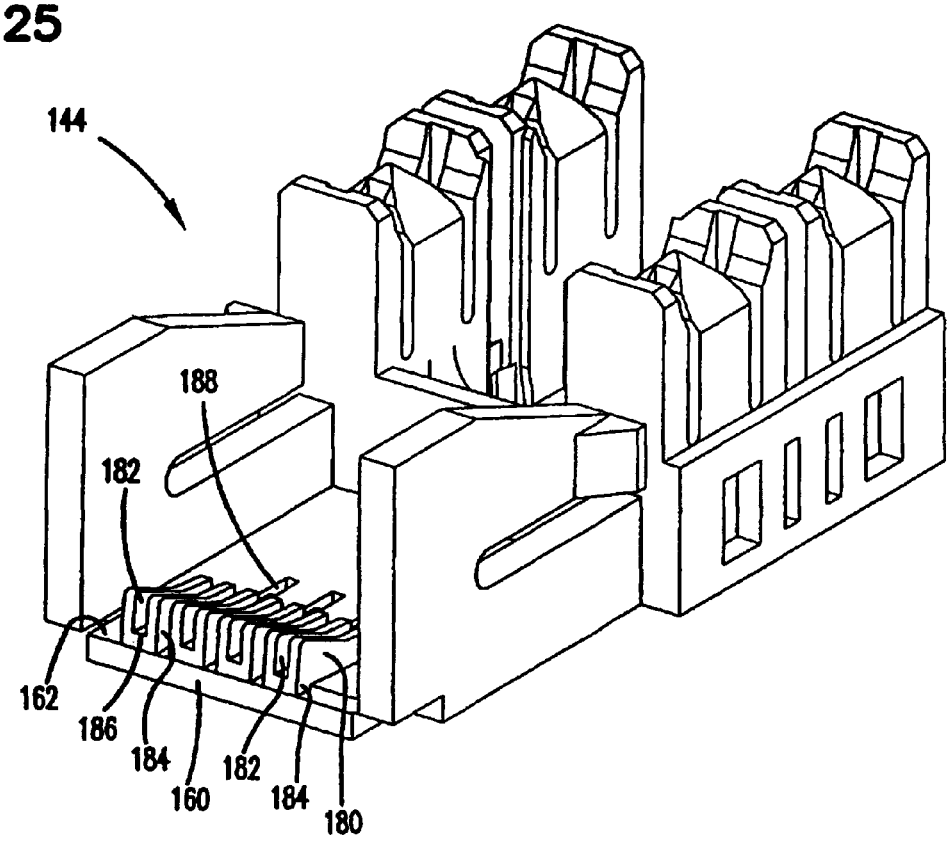
FIG. 25 is a perspective view of the contact housing of the horizontal insert assembly of FIG. 16.
Figure 26:
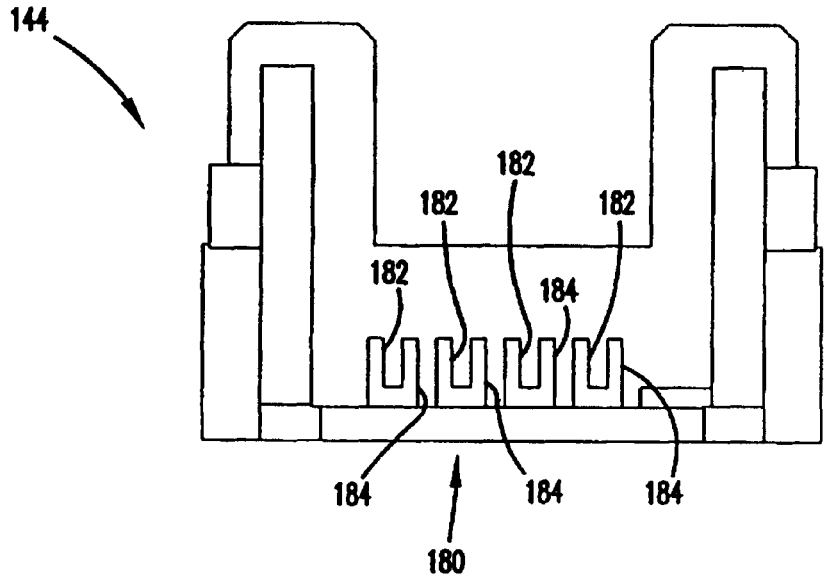
FIG. 26 is an end view of the contact housing of FIG. 25.
Figure 27:
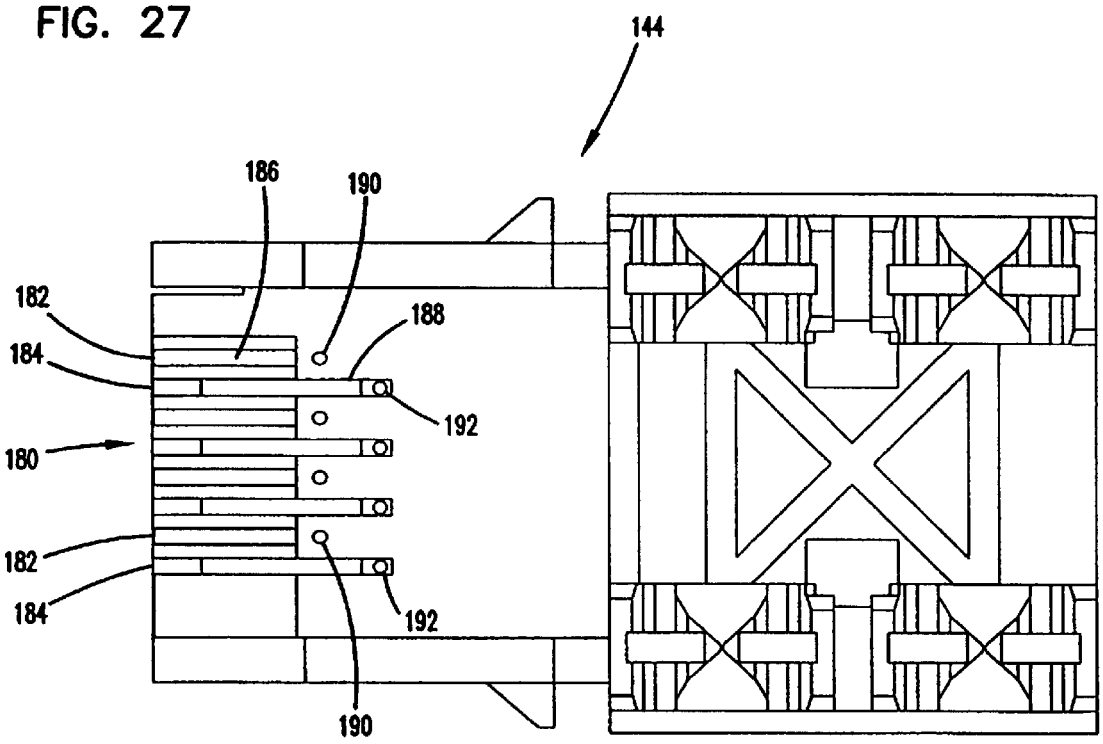
FIG. 27 is a top view of the contact housing of FIG. 25.

As shown in the FIGS., board contact end sections 200, 220 are staggered in two rows as shown in FIG. 19. Main sections 204, 224 are not parallel, and one set of spring contacts 140 includes a bend 210 in the contact section 208 which positions the distal ends of spring contacts 140, 142 so that the ends are not parallel. Also, bends 206, 226 are positioned such that the pivot points of spring contacts 140, 142 are not in the same line. These features cooperate to isolate selected spring contacts to reduce crosstalk especially at higher frequencies as may be encountered in a catagory standard.

Base 146 includes an elongate tab 240 extending toward a rear end of the assembly 134. A distal end of tab 240 includes a ramped surface 242 diverging outwardly. Tab terminates in a planar surface 244 facing end.

While the various features of each of horizontal insert assembly 134 and vertical insert assembly 34 cooperate in an advantageous manner, it is to be appreciated that the noted features may be used individually or in various combinations as desired to address crosstalk concerns. Also, while horizontally mounted printed circuit boards and vertically mounted printed circuit boards are shown, it is to be appreciated that angled printed circuit boards are also possible with an appropriately configured contact housing.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An electrical connector for connecting to a plug having a plurality of electrical contacts, the connector comprising:

a) a plurality of metallic spring contacts, each of the spring contacts including:
   1) a circuit board connection end;
   2) a first longitudinally extending section;
   3) a main bend section;
   4) a second longitudinally extending section, wherein the first longitudinally extending section, the main bend section, and the second longitudinally extending section define a general V-shape;

b) a dielectric contact housing for holding the spring contacts, wherein the contact housing defines an x-axis, a y-axis and a z-axis, the contact housing configured for receipt of the plug in a direction of the x-axis, wherein:
   1) the contact housing includes a base for receiving each of the first longitudinally extending sections of the spring contacts extending parallel to the x-axis, wherein the base defines at least one dielectric channel extending in the direction of the x-axis and positioned between the first longitudinally extending sections of two spring contacts;
   2) the base includes a front end and a rear end, the front end defining spring channels for receiving the first longitudinally extending sections of the spring contacts, wherein the dielectric channel and the spring channels define open ends at the front end of the base and extend toward the rear end of the base;

c); a printed circuit board mounted to the spring contacts at the circuit board connection ends, wherein the printed circuit board defines a plane parallel to the y and z axes.

2. The connector of claim 1, wherein the base of the contact housing includes a plurality of first longitudinal openings extending from a first exterior surface generally parallel to the x and z axes, each of the first longitudinal openings extending into the base to one of the first longitudinally extending sections of the spring contacts.

3. The connector of claim 2, wherein the base of the contact housing includes a plurality of second longitudinal openings extending from a second exterior surface generally parallel to the first exterior surface and positioned on an opposite side of the contact housing, each of the second longitudinal openings extending into the base to one of the first longitudinally extending sections of the spring contacts.

4. The connector of claim 3, wherein the first and second longitudinal openings alternate along the z-axis, wherein only one of the first and second longitudinal openings is provided for each spring contact.

*5. A jack insert comprising:*

*a circuit board having a first side positioned opposite from a second side, the circuit board also including a front end positioned opposite from a rear end;*

*a connector assembly for terminating wires to the jack insert, the connector assembly being mounted at the first side of the circuit board at a location adjacent to the rear end of the circuit board;*

*a plurality of spring contacts terminated to the first side of the circuit board, the spring contacts including contact sections located adjacent the front end of the circuit board and positioned at the first side of the circuit board; and*

*a divider positioned at the first side of the circuit board for separating the spring contacts, the divider including channels that receive the spring contacts, the channels having open sides that face away from the first side of the circuit board.*

*6. The jack insert of claim 5, further comprising elongate tabs that are elongated in a direction that extends generally between the front and rear ends of the circuit board.*

*7. The jack insert of claim 6, wherein the elongate tabs include base ends and free ends, and wherein the free ends include ramp surfaces.*

*8. The jack insert of claim 6, wherein at least portions of the spring contacts are located generally between the tabs.*

*9. The jack insert of claim 5, further comprising two tabs each having ramped surfaces, the spring contacts being located generally between the tabs.*

*10. The jack insert of claim 5, further comprising two tabs each having ramped surfaces, the divider being located generally between the tabs.*

*11. The jack insert of claim 5, wherein the insert further includes elongate tabs having a cantilevered configuration, the tabs being elongated in a direction that extends generally between the front and rear ends of the circuit board, the tabs being located at the first side of the circuit board, the tabs including ends having ramp surfaces, and the tabs being located on opposite sides of the divider.*

*12. The jack insert of claim 5, wherein the connector assembly includes an insulation displacement terminal housing that supports a plurality of insulation displacement terminals.*

*13. The jack insert of claim 12, wherein the insulation displacement terminal housing and the divider are part of a one-piece main body.*

*14. A jack insert comprising:*

*a circuit board having a first side positioned opposite from a second side, the circuit board also including a front end positioned opposite from a rear end;*

*a connector assembly for terminating wires to the jack insert, the connector assembly being mounted at the first side of the circuit board at a location adjacent to the rear end of the circuit board;*

*a plurality of spring contacts including contact sections positioned at the first side of the circuit board and located adjacent the front end of the circuit board;*

*a spring contact holder positioned at the first side of the circuit board; and*

*elongate tabs that are elongated in a direction that extends generally between the front and rear ends of the circuit board.*

*15. The jack insert of claim 14, wherein the elongate tabs include base ends and free ends, and wherein the free ends include ramp surfaces.*

*16. A jack insert comprising:*

*a circuit board having a first side positioned opposite from a second side, the circuit board also including a front end positioned opposite from a rear end;*

*a connector assembly for terminating wires to the jack insert, the connector assembly being mounted at the*

*first side of the circuit board at a location adjacent to the rear end of the circuit board;*

*a plurality of spring contacts including contact sections positioned at the first side of the circuit board and located adjacent the front end of the circuit board;*

*a spring contact holder positioned at the first side of the circuit board; and*

*two tabs each having ramped surfaces, at least portions of the spring contacts being located generally between the tabs.*

*17. A jack insert comprising:*

*a) a connector mount having a first side positioned opposite from a second side, wherein the first side of the connector mount includes a front divider and a rear connector assembly, wherein the rear connector assembly includes two rows of means for terminating conductive wires extending adjacent opposite edges of the first side, and wherein the front divider includes a plurality of channels having open sides that face away from the first side of the connector mount;*

*b) a plurality of spring contacts separated by the divider; and*

*c) a circuit board having first and second sides, the spring contacts being terminated to the first side of the circuit board, and the circuit board being mounted at the second side of the connector mount with the first side of the circuit board facing the second side of the connector mount.*

*18. The jack insert of claim 17, wherein the connector mount includes elongate tabs positioned at the first side of the connector mount, the elongate tabs having lengths that extend generally along the opposite edges of the first side of the connector mount.*

*19. The jack insert of claim 18, wherein the elongate tabs include ends having ramped surfaces.*

*20. The jack insert of claim 18, wherein the divider is positioned generally between the elongate tabs.*

*21. The jack insert of claim 18, wherein at least portions of the spring contacts are positioned generally between the elongate tabs.*

*22. The jack insert of claim 17, wherein the connector mount comprises a unitary piece.*

*23. A jack comprising:*

*a jack housing defining a port for receiving a plug;*

*a jack insert that mounts within the jack housing, the jack insert including:*

*a) a connector mount having a first side positioned opposite from a second side, wherein the first side of the connector mount includes a front divider and a rear connector assembly, wherein the rear connector assembly includes two rows of means for terminating conductive wires extending adjacent opposite edges of the first side, and wherein the front divider includes a plurality of channels having open sides that face away from the first side of the connector mount;*

*b) a plurality of spring contacts separated by the divider; and*

*c) a circuit board having first and second sides, the spring contacts being terminated to the first side of the circuit board, and the circuit board being mounted at the second side of the connector mount with the first side of the circuit board facing the second side of the connector mount.*

*24. A jack insert comprising:*

*a) a connector mount having a first side positioned opposite from a second side, wherein the first side of the connector mount includes a front spring holder and a rear connector assembly, wherein the rear connector assembly includes two rows of means for terminating conductive wires extending adjacent opposite edges of the first side, wherein the connector mount also includes tabs positioned at the first side of the connector mount, and wherein the front spring holder is positioned generally between the tabs;*

*b) a plurality of spring contacts separated by the divider; and*

*c) a circuit board to which the spring contacts are terminated, the circuit board being mounted at the second side of the connector mount.*

*25. The jack insert of claim 24, wherein the tabs comprise elongate tabs having lengths that extend generally along the opposite edges of the first side of the connector mount.*

*26. The jack insert of claim 25, wherein the elongate tabs include ends having ramped surfaces.*

*27. The jack insert of claim 24, wherein the connector mount comprises a unitary piece.*

*28. A jack insert comprising:*

*a) a connector mount having a first side positioned opposite from a second side, wherein the first side of the connector mount includes a front spring holder and a rear connector assembly, wherein the rear connector assembly includes two rows of means for terminating conductive wires extending adjacent opposite edges of the first side, wherein the connector mount also includes elongate tabs positioned at the first side of the connector mount, and wherein the elongate tabs have lengths that extend generally along the opposite edges of the first side of the connector mount;*

*b) a plurality of spring contacts separated by a divider; and*

*c) a circuit board to which the spring contacts are terminated, the circuit board being mounted at the second side of the connector mount.*

* * * * *